US009141747B1

(12) United States Patent
Orthner

(10) Patent No.: US 9,141,747 B1
(45) Date of Patent: *Sep. 22, 2015

(54) SYSTEM LEVEL TOOLS TO SUPPORT FPGA PARTIAL RECONFIGURATION

(71) Applicant: Altera Corporation, San Jose, CA (US)

(72) Inventor: Kent Orthner, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/538,697

(22) Filed: Nov. 11, 2014

Related U.S. Application Data

(63) Continuation of application No. 13/964,430, filed on Aug. 12, 2013, now Pat. No. 8,910,109.

(51) Int. Cl.
 *G06F 15/04* (2006.01)
 *G06F 17/50* (2006.01)
(52) U.S. Cl.
 CPC .................. *G06F 17/5068* (2013.01)
(58) Field of Classification Search
 USPC ........................................................ 716/139
 See application file for complete search history.

(56) References Cited

U.S. PATENT DOCUMENTS 7,565,280 B2 * 7/2009 Moriat ............................ 703/22

OTHER PUBLICATIONS

Robinson, D.; Lysaght, P.; "Methods of exploiting simulation technology for simulating the timing of dynamically reconfigurable logic," May 2000, IEE Proc.-Comput. Digit. Tech, vol. 147, No. 3.*

* cited by examiner

*Primary Examiner* — Eric Lee
(74) *Attorney, Agent, or Firm* — Weaver Austin Villeneuve & Sampson LLP

(57) ABSTRACT

Various embodiments of the present disclosure provide techniques for enabling a user to efficiently design a programmable logic device (PLD) capable of partial reconfiguration. In some implementations, a processor is configured to run a system level design tool and accepts, as inputs from a user, an identification of at least two personas to be used within a reconfigurable region of the PLD. The design tool defines one or more boundaries of a partial reconfig (PR) domain, the PR domain including a partitioned reconfigurable region of the PLD that is selectably configurable as any of the at least two personas. In some implementations, the PR domain includes at least one IP component configured to safely shut down at least one signal, the at least one signal originating from or directed toward an element of the PLD outside of the PR domain.

19 Claims, 10 Drawing Sheets

US 9,141,747 B1

SYSTEM LEVEL TOOLS TO SUPPORT FPGA PARTIAL RECONFIGURATION

CROSS-REFERENCE TO RELATED APPLICATIONS

This patent application is a continuation of and claims priority, under 35 U.S.C. §120, to U.S. patent application Ser. No. 13/964,430, filed Aug. 12, 2013, and titled "SYSTEM LEVEL TOOLS TO SUPPORT FPGA PARTIAL RECONFIGURATION", which is hereby incorporated by reference in its entirety.

TECHNICAL FIELD

The present disclosure generally relates to integrated circuits and, more particularly, to techniques for designing an integrated circuit that includes a programmable logic device (PLD) such as a field programmable gate array (FPGA) that may undergo partial reconfiguration.

BACKGROUND

A PLD is a semiconductor integrated circuit that contains logic circuitry that can be programmed ("designed") by a user to perform a host of logic functions. An FPGA is an example of a PLD that may benefit from the presently disclosed system design tools and techniques. The assignee of the present invention develops and manufactures PLDs including those that incorporate embedded processors, and complex programmable logic devices (CPLDs). These semiconductor integrated circuits, or chips, may be designed by a purchaser ("user") for use in the user's own electronic systems.

Normally, reconfiguring a designed PLD requires the PLD user to place the PLD in a reset mode while a controller is used to load a different design onto it. "Partial reconfiguration" of a PLD, as the term is used herein and in the claims, means making a change to a portion of a PLD while at least one other portion is still operating. Partial reconfiguration allows for some parts of the designed PLD to continue operating while a controller loads a partial design into another portion of the PLD. The controller may be within an operating portion of the PLD or within an external component.

Partial reconfiguration provides various benefits to the user, including reduction in the size, cost, and power consumption of the PLD and improved fault tolerance/reliability. For example, using a partial reconfiguration technique permits selectively powering down parts of a PLD, while the remainder of the PLD continues to operate normally. As a further example, a partial reconfiguration technique may be used to simulate a single event upset (SEU) so that a designer is enabled to test a response of a PLD design to various possible SEU events. Moreover, if an SEU event causes data corruption that cannot be cured by rewriting the corrupted data, a partial reconfiguration technique may be used to isolate the damaged portion of the PLD, while the remainder of the PLD continues to operate normally.

In the absence of the present teachings, it is a difficult and error-prone task for a user to develop a PLD design capable of partial reconfiguration. The present disclosure provides a set of system-level techniques and design tools that make developing a PLD design intended to support partial reconfiguration relatively more efficient.

SUMMARY OF INVENTION

The presently disclosed techniques enable a user to efficiently design a programmable logic device (PLD) capable of partial reconfiguration.

In some implementations, a processor is configured to run a system level design tool and accepts, as inputs from a user, an identification of at least two personas to be used within a reconfigurable region of the PLD. The design tool defines one or more boundaries of a partial reconfig (PR) domain, the PR domain including a partitioned reconfigurable region of the PLD that is selectably configurable as any of the at least two personas.

In some implementations a PLD includes a PR domain. The PR domain includes a partitioned reconfigurable region of the PLD that is selectably configurable as any of at least two personas. The PR domain includes at least one IP component configured to safely shut down at least one signal, the at least one signal originating from or directed toward an element of the PLD outside of the PR domain.

These and other features will be presented in more detail in the following specification of the invention and the accompanying figures, which illustrate by way of example the principles of the invention.

BRIEF DESCRIPTION OF THE DRAWINGS

The included drawings are for illustrative purposes and serve only to provide examples of possible implementations of the disclosed inventive techniques. These drawings in no way limit any changes in form and detail that may be made by one skilled in the art without departing from the spirit and scope of the disclosed implementations.

Figure 1:
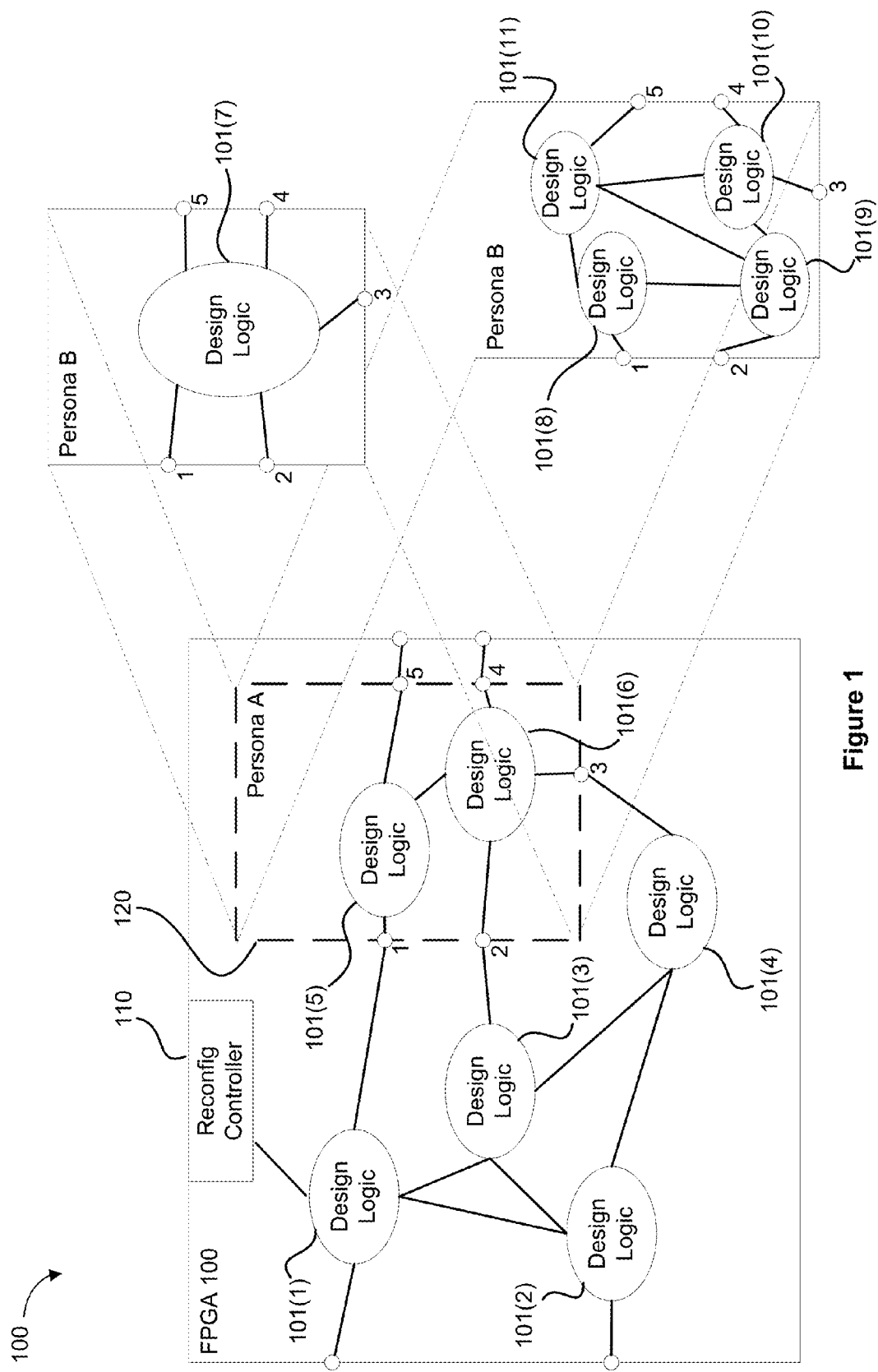
FIG. 1 illustrates a programmable logic device configured to support partial reconfiguration.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the disclosed subject matter, as defined by the appended claims.

DETAILED DESCRIPTION

Reference will now be made in detail to embodiments of the present invention. Examples of these embodiments are illustrated in the accompanying drawings. While the invention is described in conjunction with these embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques and mechanisms of the present invention will be described in the context of particular types of devices. However, it should be noted that the techniques and mechanisms of the present invention apply to a variety of different types of devices. In the following description, numerous specific details are set forth in order to provide a thorough understanding of the present invention. Particular exemplary embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that various embodiments may include multiple iterations of a technique or multiple instantiations of a mechanism unless noted otherwise. For example, a system may use a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to a memory component, but it will be appreciated that a variety of bridges and controllers may reside between the processor and memory. Consequently, a connection does not necessarily mean a direct, unimpeded connection unless otherwise noted.

As used herein, and in the claims, the term "PLD" means a programmable logic device such as, for example, an FPGA or any other programmable hardware on a chip where a portion of the chip is configured to be retargetable to perform a new hardware function that requires a driver to be tied to it.

The present disclosure relates to a system level design tool and other techniques which enable a user to efficiently design an FPGA capable of partial reconfiguration. As the term is used herein and in the claims, a system level design tool is a tool that supports user development of a PLD design at a relatively high level of abstraction. Such a tool, for example, enables a user to implement a PLD design without regard to a specific register transfer level (RTL) implementation. Examples of system-level design tools made available to users by the assignee of the present invention include Qsys, DSP Builder, and System Console.

A better understanding of features and benefits of the presently disclosed techniques may be achieved by referring first to FIG. 1, which illustrates an FPGA 100 configured to support partial reconfiguration. In the illustrated implementation, FPGA 100 has been designed to include design logic modules 101(1), 101(2), 101(3), and 101(4) and reconfig controller 110 located outside a partitioned region 120. Partitioned region 120 may include one or more design logic modules and may be reconfigurable as described hereinbelow. In the illustrated implementation, partitioned region 120 is shown to have interfaces at points 1, 2, 3, 4, and 5 with elements of the FPGA 100 that are outside the partitioned region 120. The contents of the region 120 may be referred to herein as a "persona". Thus, in the illustrated implementation, Persona A includes design logic modules 101(5) and 101(6) and is operatively coupled to interface points 1, 2, 3, 4, and 5. Persona B is illustrated to include design logic modules 101 (7) and is operatively coupled to interface points 1, 2, 3, 4, and 5. Persona C is illustrated to include design logic modules 101(8), 101(9), 101(10), and 101(11), and is likewise operatively coupled to interface points 1, 2, 3, 4, and 5.

In some implementations, partial reconfiguration of FPGA 100 may be performed under control of reconfiguration controller 110, while the FPGA 100, outside partitioned region 120, is fully or partially operating. More particularly, for example, Persona A may be replaced with Persona B or with Persona C.

In some implementations, a PLD may be operable with two or more different personas having similar basic functionality, but different characteristics of, for example, security, reliability and performance. As a result, a user may be able to select a persona featuring a suite of performance, reliability and performance characteristics most suitable for the user's initial needs, and, as those needs change, implement later a persona offering a different suite of performance, reliability and performance characteristics. Similarly, providers of PLD designs may be enabled to create licensing arrangements wherein a user receives a free license to a lower performance persona free, and but is required to pay a fee for reconfiguring the PLD with higher performance persona.

The present inventor has developed techniques and tools wherewith a reconfigurable PLD may be efficiently designed and implemented. For example, in some implementations, a system-level design tool defines one or more boundaries of a portion of an FPGA or other PLD. The portion may be referred to as a "partial reconfig domain" or "PR domain", and may include a partitioned reconfigurable region of the PLD that is selectably configurable as any of the at least two personas. In some implementations, the system design tool may enable a user to select a region and indicate that it is to be a PR domain. The functional logic or other content (also referred to herein as a "persona") that may be used within the PR domain, may include IP cores, Qsys subsystems, DSP Builder blocks, or any other type of subcomponent that the high level system design tool supports, including, for example OpenCL systems.

In some implementations, a "Partial Reconfig Region" IP component may be identified as representing the area that can be reconfigured. The Partial Reconfig Region IP component may include a logical representation of a PR domain with some supporting logic, for example. In some implementations, the IP component may include a machine-readable description of all the interfaces in the PR domain, as well as a list of the personas that can be used in the PR domain.

Figure 2:
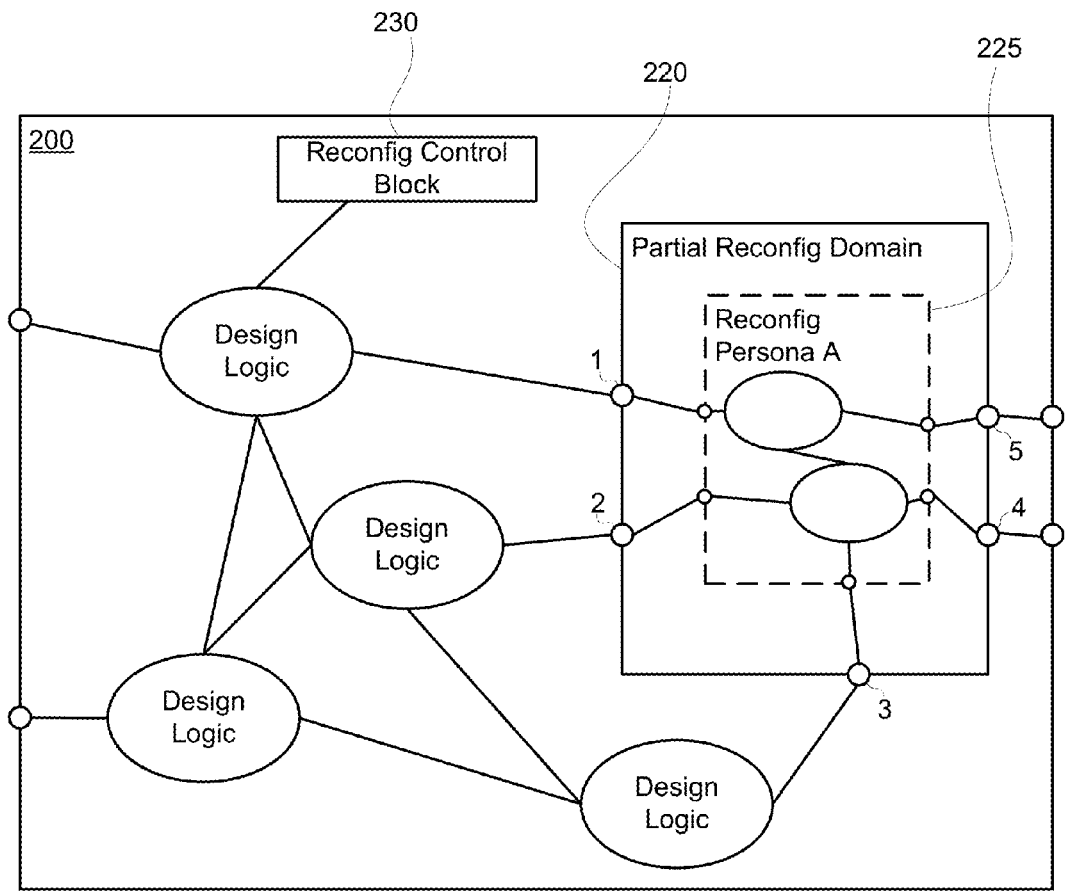
FIG. 2 illustrates a further implementation of a programmable logic device (PLD) configured to support partial reconfiguration.

When a PR domain has been identified, the system level design tool may enable a user to specify a set of interfaces between the PR domain and elements of PLD 200 outside PR domain 220. The set of interfaces may define the interface requirements that any persona intended to be used in the PR domain must support. Put another way, the design tool may insure that no persona to be used in the PR domain has an interface that is not supported by the PR domain. For example, the design tool may define a shell compatible in size and interfaces with all personas intended for use in the PR domain. Referring now to FIG. 2, for example, the design tool may ensure that the PR domain 220 of PLD 200 is sized to fit, in addition to the illustrated Reconfig Persona A 225, all other personas that are intended for use in PR domain 220. Accordingly, the design tool may ensure that the PR domain 220 has interfaces 1, 2, 3, 4, and 5 that are compatible with each such persona.

In some implementations, the system level design tool may be configured to capture a list of the personas intended for use in PR domain 220. The list may include, for example, a list of interfaces that define a superset interface boundary of the PR domain.

In the illustrated implementation, PLD 200 includes reconfig control block 230. The reconfig control block 230 may be configured to execute a reconfiguration of PR domain 220, for example. Advantageously, the control block 230 may include logic that implements a documented state machine to execute a partial reconfiguration. In some implementations, reconfig control block 230 may be processor controllable and be configured to allow a processor, such as a Nios II Soft processor, for example, to write to the reconfig control block 230. Reconfig control block 230 may then control shut down of interfaces 1, 2, 3, 4, and 5. In some implementations, reconfig control block 230 may be configured to shut down interfaces 1, 2, 3, 4, and 5 in a particular temporal sequence.

In embodiments where reconfig control block 230 implements the state machine, demands on the processor may, advantageously, be limited to writing new partial reconfig data to some registers. When the partial reconfiguration is complete, the control block 230 may signal to re-enable all the interface controllers (not illustrated) disposed between persona 225 and a respective interface between PR domain 220 and an element of PLD 200 outside PR domain 220.

Figure 3:
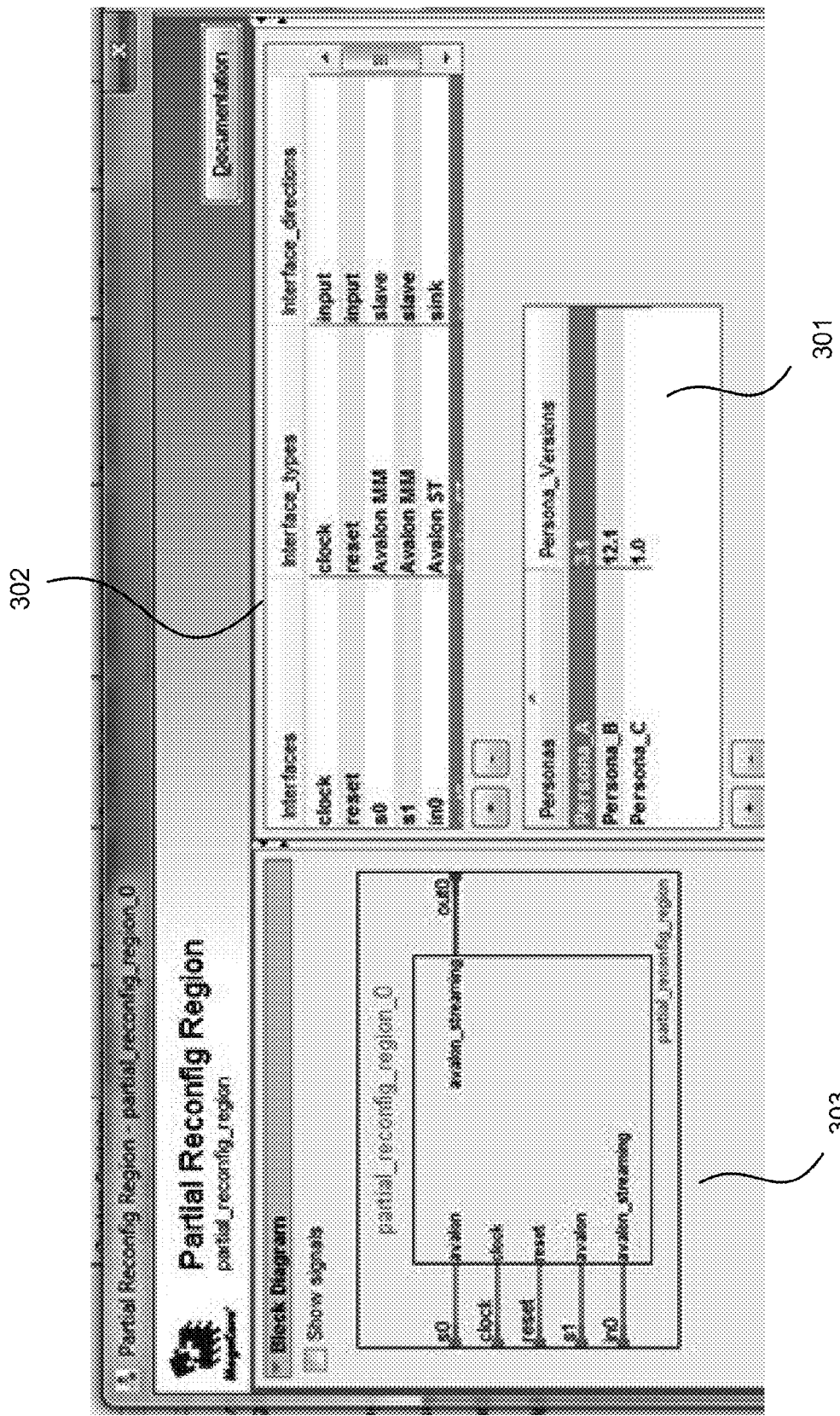
FIG. 3 shows a graphical user interface (GUI) mode for a design tool in which interface details of one or more personas may be presented to a user.
Figure 4:
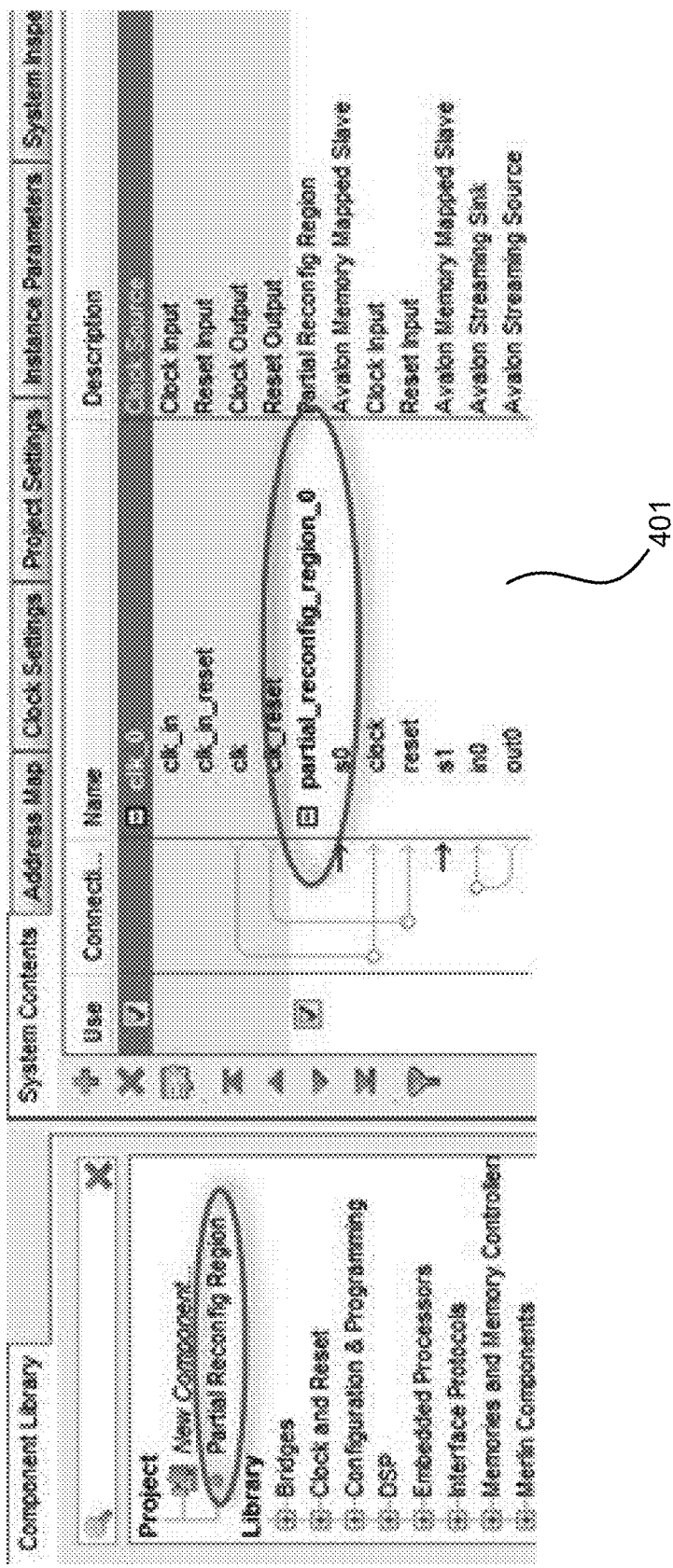
FIG. 4 shows another GUI mode for a design tool in which interface details of one or more partial reconfig (PR) domains are illustrated.
Figure 5:
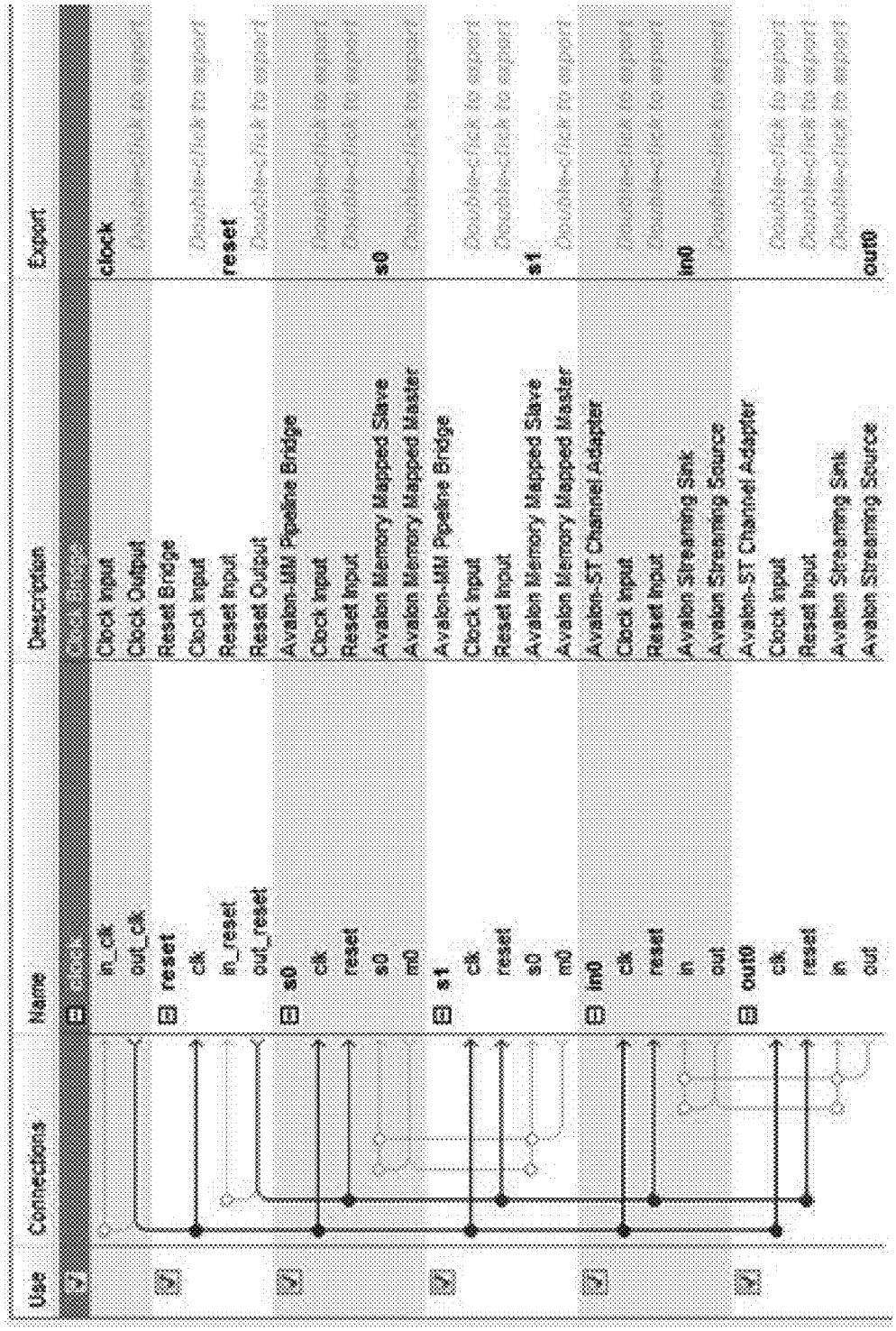
FIG. 5 illustrates a GUI mode presenting an example of a template that imposes a compatible subset of interfaces on a new persona design.

In some implementations, the system level design tool may provide a graphical user interface (GUI) with which a user may interact during design of a reconfigurable PLD. Referring now to FIGS. 3-5, for example, partial screen shots of an example GUI is illustrated with which design of PR domain 220 and associated personas may be facilitated. FIG. 3 shows a first GUI mode in which interface details of one or more personas may be presented to a user. In the illustrated example, window 301 presents a list of personas that may be available, or, for example, that have been already designed or that may be undergoing design. Here, "Persona A" is highlighted, meaning for example, it has been selected by the user. As a result of such selection, in the illustrated example, window 302 may present a list of interfaces corresponding to Persona A and window 303 may show a block diagram of the listed interfaces. A list of interfaces corresponding to a particular persona may be referred to herein as a subset of interfaces.

Referring to FIG. 4, an example of a second GUI mode is illustrated, in which interface details of one or more PR Domains, referred to in FIG. 4 as "Partial Reconfig Regions", are illustrated. In window 401, a list of interfaces associated with partial_reconfig_region_0 is provided. The partial_reconfig_region_0 may correspond to PR Domain 220, for example. The list may define a superset of boundary interfaces that includes subsets of interfaces associated with each persona identified for possible use in partial_reconfig_region_0. As a result, the design tool may ensure that each persona has a subset of interfaces compatible with the superset of boundary interfaces.

In some implementations, the system level design tool may facilitate design of a new persona. For example, once the superset of boundary interfaces of a PR domain is defined for a first set of one or more personas, the user may be enabled to initiate creation of a new persona. In some implementations, the design tool may display a GUI mode including a template that imposes the compatible subset of interfaces on the new persona design.

FIG. 5 illustrates a GUI mode presenting an example of the above described template. The template, already populated with all of the interfaces available in the system, may be generated by the design tool in response to a user's request to initiate creation of a new persona. The user may then be enabled to create and edit features of the new persona. In some implementations, the design tool may prevent the user from including in the new persona an external interface not already included in the subsystem template. Alternatively, the design tool may be configured to emit an error message to the user if the new persona includes an external interface not already included in the subsystem template.

In some implementations, the system level design tool may be configured to automatically add registers for PR persona identification and status. For example, the design tool may be configured to assign a unique identifier to at least one persona to be used in the PR domain. Moreover, in some implementations, the design tool may automatically instantiate a reconfiguration status block inside at least one persona used in the PR domain.

When a persona includes an identification block and/or a reconfiguration status block, the elements of the reconfigurable PLD outside the PR domain may be configured to recognize the identity and status of the persona. For example, such elements may be configured to read from a control and status register of the persona at any time. In some implementations, the persona may additionally, or alternatively, provide signals indicating the level of readiness of the persona, such as if the persona has been programmed, reset, and/or initialized.

In some implementations, the system level design tool may provide one or both of the identification block and the reconfiguration status block as an available IP component. Moreover, the persona template may be configured to automatically insert and parameterize one or both of the identification block and the reconfiguration status block.

In some implementations, the system level design tool may be configured to identify partial reconfiguration domains and automatically provide registers for persona identification and status. The design tool may be configured to assign each persona in a partial reconfig domain a unique identifier, for example, and may instantiate a small status block inside each persona. Advantageously, elements of the PLD outside of the PR domain may be enabled to read from a control and status register at any time to identify the currently programmed persona, and/or to see if no persona was present at all. There could also be signals within the persona that tell the status block the level of readiness of the persona, such as if it has been programmed, reset, and/or initialized.

Figure 6:
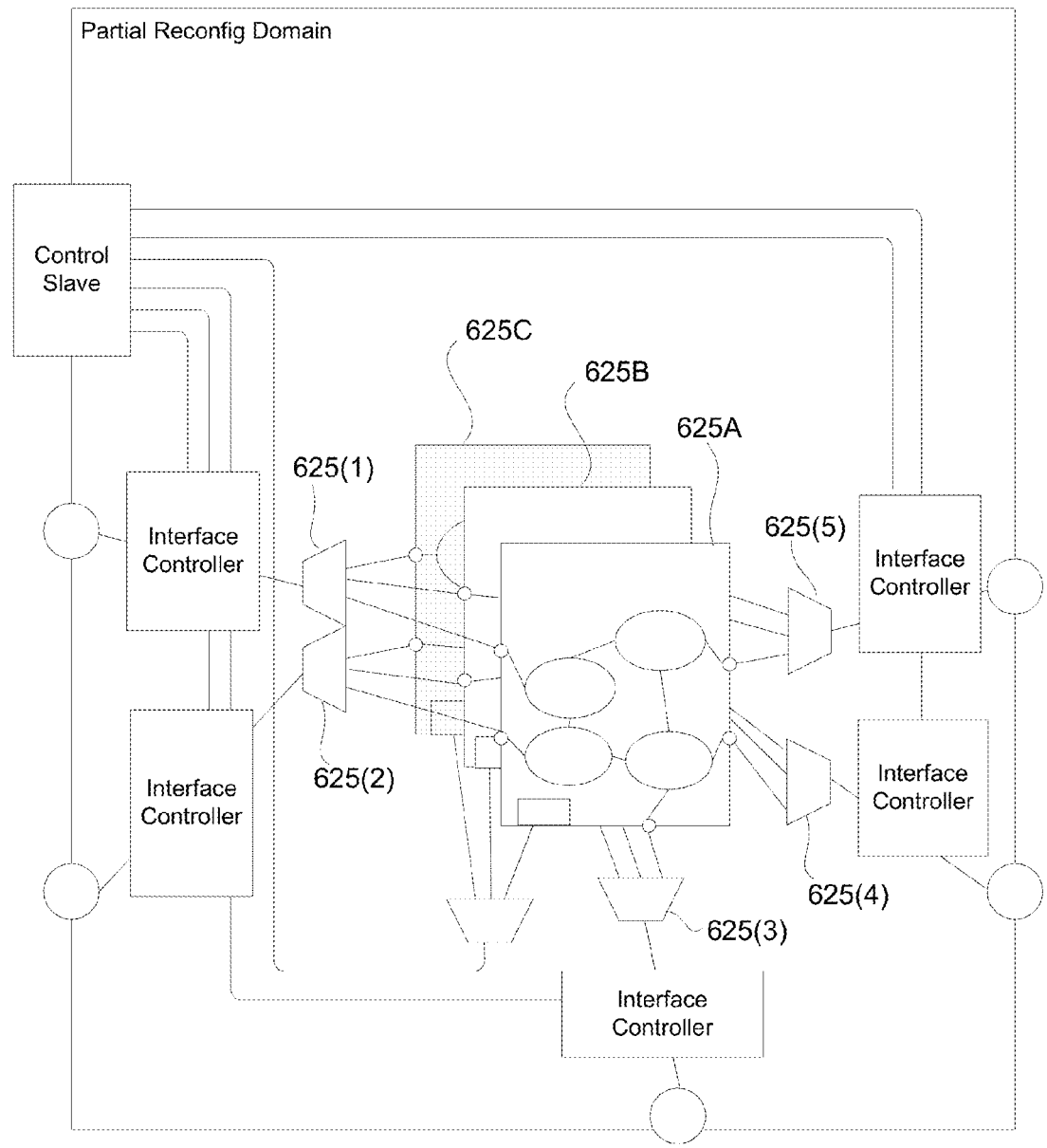
FIG. 6 shows an example of a how partial reconfiguration can be simulated by instantiating the various personas and selecting between them in the simulation.

In some implementations, the system level design tool may be configured to support simulations of partial reconfiguration. For example, the design tool may provide simulation models for the IP components within a PR domain. Referring now to FIG. 6, an example simulation model is illustrated. In some implementations, a simulation model of a PR domain IP component may include an instance of each persona 625A, 625B, and 625C, with multiplexers to select which persona to simulate as being connected to selected elements of a PLD outside the PR domain.

In some implementations, a simulation model of the reconfig control block would be responsible for simulating a multiplexer select line, and selecting the active persona. All personas other than the active persona may be held in reset.

In some implementations, the simulation model of a PR controller could also be used to simulate reconfiguration errors, so that a user could test a design's reconfiguration error handling capabilities. Advantageously, the simulation model of the PR controller may also include a functional coverage monitor, configured to inform the user when the simulation has covered all of the interested cases to be tested when related to partial reconfig.

In some implementations, the system level design tool may be required to provide memory map information to downstream embedded software tools. In the case of partial reconfiguration, the memory map of a system can be expected to change as a function of which persona is active. Advantageously, the design tool may be configured to report a respective memory map of each persona, along with an identification of each persona as reported, for example, by the reconfiguration status block. As a result, the embedded software may be currently informed of the current state of the memory map.

The system level tool may support a number of "toolkits" used for debugging various portions of a PLD design. Examples of such toolkits, developed by the assignee of the present application, include the "Transceiver" toolkit for debugging transceiver options and functionality and the "External Memory Interface" (EMIF) toolkit for debugging memory interface configuration and calibration.

In some implementations, a the toolkits may enable a user to observe which persona was programmed, if any; similarly, the user may be enable to observe which interfaces are shut down, vs. operating normally or waiting for an end or packet or transaction response. A toolkit may also be configured to allow a host PC to reconfigure the PR domain directly, without requiring the use of an embedded processor or state machine in the FPGA.

In some implementations, a PR Domain IP component may be configured to provide a "PR trace" functionality. The PR trace functionality may keep track of when different interfaces are shut off and turned on, when the reconfig controller transitioned through various states, when resets were asserted to coming and going personas, and what persons were in the system. In case of a system error, debug tools may be configured to read back all of this information to help determine the cause of a reconfig error.

Figure 7:
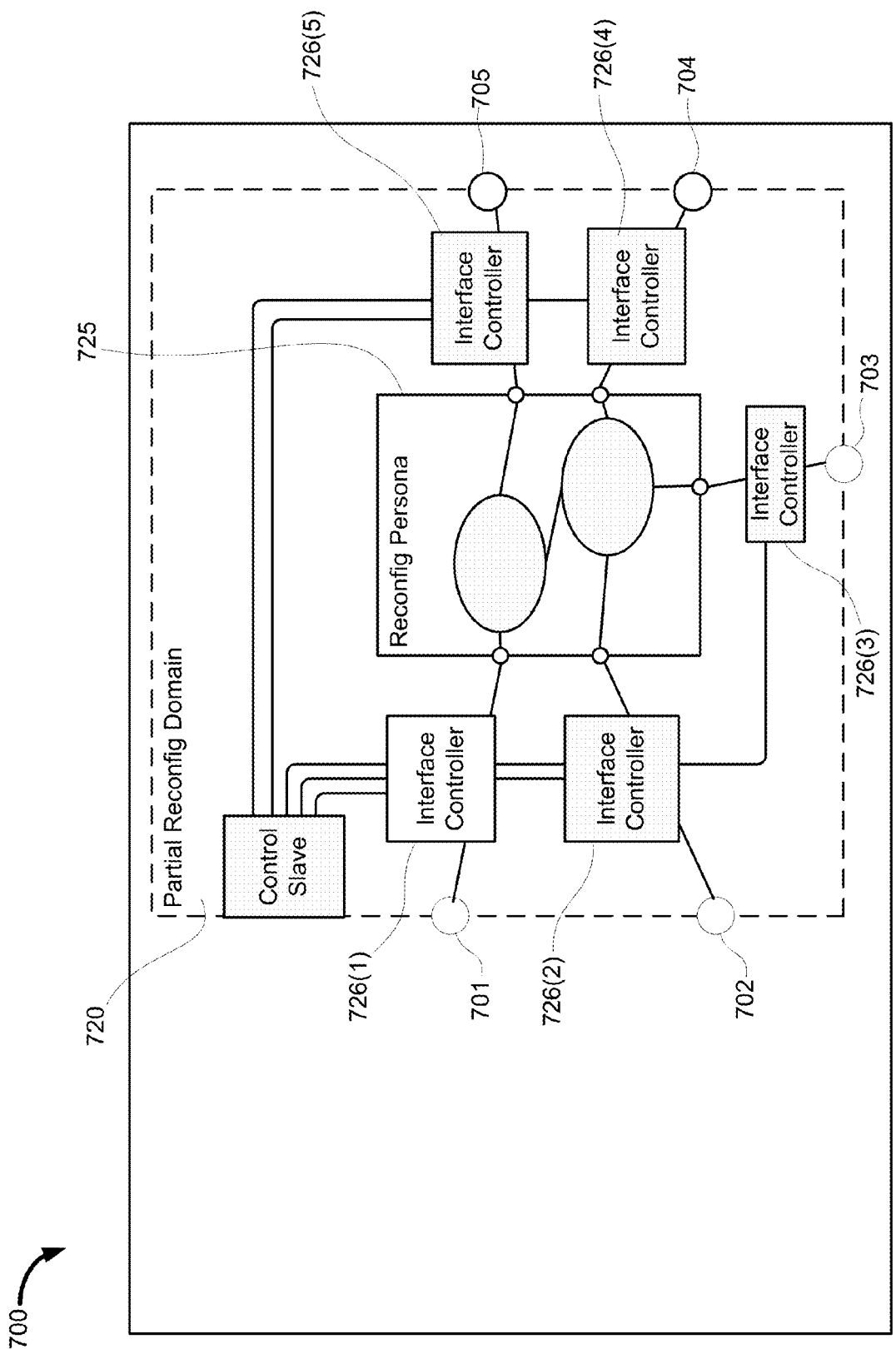
FIG. 7 shows an example implementation of a PLD including a PR domain, illustrating interface controllers.

Referring now to FIG. 7, an example implementation of a PLD including a PR domain will be described. In the illustrated example, PLD 700 includes PR domain 720 which in turn includes Reconfig Persona 725. PR domain 720 may include IP components configured to safely shut down signals originating from or directed toward an element of PLD 700 outside PR domain 720. In the illustrated example, IP components are illustrated as a number of interface controllers 726. Each interface controller 726(*i*) is disposed between persona 725 and a respective interface between PR domain 720 and an element of the PLD outside PR domain 720. For example, interface controller 726(1) is disposed between persona 725 and interface 701. Similarly, interface controller 726(2) is disposed between persona 725 and interface 702; interface controller 726(3) is disposed between persona 725 and interface 703; interface controller 726(4) is disposed between persona 725 and interface 704; and interface controller 726(5) is disposed between persona 725 and interface 705.

Features and benefits of the interface controllers 726 may be better understood by appreciating that logic inside persona 725 is not operational while it is being reconfigured. Rather, the logic inside persona 725 is essentially destroyed, and, in the absence of the presently disclosed techniques, interfaces with PLD 700 could not be relied upon to stay at a fixed state. The presently disclosed techniques ensure that the logic surrounding persona 725 is not sensitive to transitions of the outputs from persona 725 during reconfiguration.

The presently disclosed techniques may also ensure that certain system-level effects of reprogrammability are considered. For example, in the absence of the present teachings, a problem may arise when a master component in PLD 700 issues a read command into a slave component within the persona 725, and the persona 725 is then reconfigured. An expected response to the command may not be returned, and the master component may wait for a prolonged time, effectively locking up PLD 700.

Advantageously, because the system level design tool knows the boundaries of the PR domain 720 as high-level interface descriptions, it is able to incorporate in PR domain 720 interface controllers 726 that safely shut down interfaces with the persona 725. As a result, PLD 700 may be desensitized to interface signal transitions during a reconfiguration of persona 725. Moreover, interface controllers 726 may be configured to restart the interfaces safely.

In some implementations, persona 725 may be configured to receive and execute a command related to an upcoming reconfiguration. For example, it may be advantageous to signal the persona 725 of the upcoming reconfiguration, so that the persona 725 can finish some task in a clean manner, such as relinquishing control over an external device. This signaling may occur using interface controllers 726. In some implementations, PLD 700 may send transactions via an interface controller 726 to the persona 725. Interface controller 726 may, for example, be configured as an Avalon slave interface, in accordance with the Avalon Interface Specification, developed by the assignee of the present application, and incorporated herein by reference in its entirety.

Each interface controller 726 may resemble a bridge for a respective interface type, with additional control signaling to signal, for example when a respective interface may be safely shut down and when respective interface may be safely restarted. Moreover, an interface controller 726 may be configured to issue a status signal that indicates whether the persona 725 may be safely reconfigured.

In some implementations, interface controller 726 may be configured to safely shut down or restart an interface related to one or more of a reset input, a memory mapping interface, a streaming interface, and a conduit interface or other types of interfaces.

For example, where the interface is related to a reset input, the interface controller could 726 may be configured to hold the reset in a desired state during reconfiguration of persona 725. The desired state may vary depending on the nature of the PLD 700 and/or PR domain 720. For example, in some cases, it might be desired to assert reset to a current persona during reconfiguration. In other cases, reconfiguring may be performed while the persona is not held in reset, but then reset may be asserted once a new persona has been configured.

In some implementations, the PR domain 720 may include a memory mapped slave. The memory mapped slave may, for example, be compatible with one or more specifications such as Avalon Memory Mapped, developed by the assignee of the present application, and ARM Holding's Advanced eXtensible Interface, Advanced Peripheral Bus, Advanced High performance Bus, or other memory mapped protocol. In such implementations, one or more of interface controllers 726 may be configured to ensure that the PR domain 720 is not reconfigured while a master is waiting for a response, thereby avoiding back pressuring the master.

For example, interface controller 726 may be configured to maintain a count of all outstanding transactions that had been issued to the current persona. When a signal is received indicating that a reconfiguration event is upcoming, interface controller 726 may be configured to stop incoming transactions, and to wait until all outstanding transaction responses have been returned. For example, the reconfiguration event may be postponed until an outstanding transaction counter of interface controller 726 reaches zero. Once the counter reaches zero, the interface controller 726 may signal that it is ready for reconfiguration, for example. Subsequent to the reconfiguration event, the interface controller 726 may be configured to re-enable transactions into the PR domain 720 on a transaction boundary, and not let in any partial transactions.

In some implementations interface controller 726 may be configured to stop new transactions. In a first mode, interface controller 726 may be configured to stop new transactions by asserting a backpressure signal preventing new transactions from arriving. A suitable backpressure signal may include a waitrequest signal in accordance with the Avalon Interface Specification. Any master that accessed the slave would wait until the reconfiguration was complete. In a second mode, interface controller 726 may accept the command and respond on behalf of the slave with an error indication, allowing the master to recover gracefully and continue. A decision as which of these two modes to use may be made by the user based on system-level considerations. In some implementations interface controller 726 may be selectably configured to operate in accordance with the first mode or the second mode.

In some implementations, the PR domain 720 may include a memory mapped master. In such implementations, one or more of interface controllers 726 may be configured to ensure that, when a signal is received indicating that a reconfiguration event is upcoming, the master is stopped from issuing new commands, and to ensure all outstanding transaction responses have been returned. Upon startup, interface controller may ensure that the first transaction that the new persona emits is a clean transaction on a transaction boundary.

In some implementations, the PR domain 720 may include a source or a sink for streaming data. For example the source or the sink may communicate with an element of the PLD 700 outside of the PR domain 720 in accordance with the Avalon Streaming specification developed by the assignee of the present invention. In some implementations where PR domain 720 includes a streaming sink, interface controller 726 may be configured to include a parameter that defines an "off" condition for the streaming sink. For example, interface controller 726 may deassert a ready signal associated with the sink, thereby backpressuring potential masters. In the case of packetized streaming interface, upon being asked to shut down the interface, the interface controller 726 may be configured to finish accepting the current packet, and shut down cleanly on a packet boundary.

In some implementations where PR domain 720 includes a streaming source, interface controller 726 may be configured to stop issuing new data when there are no outstanding partial packets. In the case of a non-packetized interface, interface controller 726 may be configured to stop sending data immediately.

In some implementations interface controller 726 may be configured to safely interrupt a user-defined signal interface between PR domain 720 and an element of the PLD 700 outside of the PR domain 720. The user-defined signal interface, which may also be referred to as "Conduit" interface, may not conform to a standard interface protocol recognizable by the system level design tool or by interface controller 726. In such implementations, interface controller 726 may, for example, be configured to hold signals at known good values, where the values are specified by the user.

Figure 8:
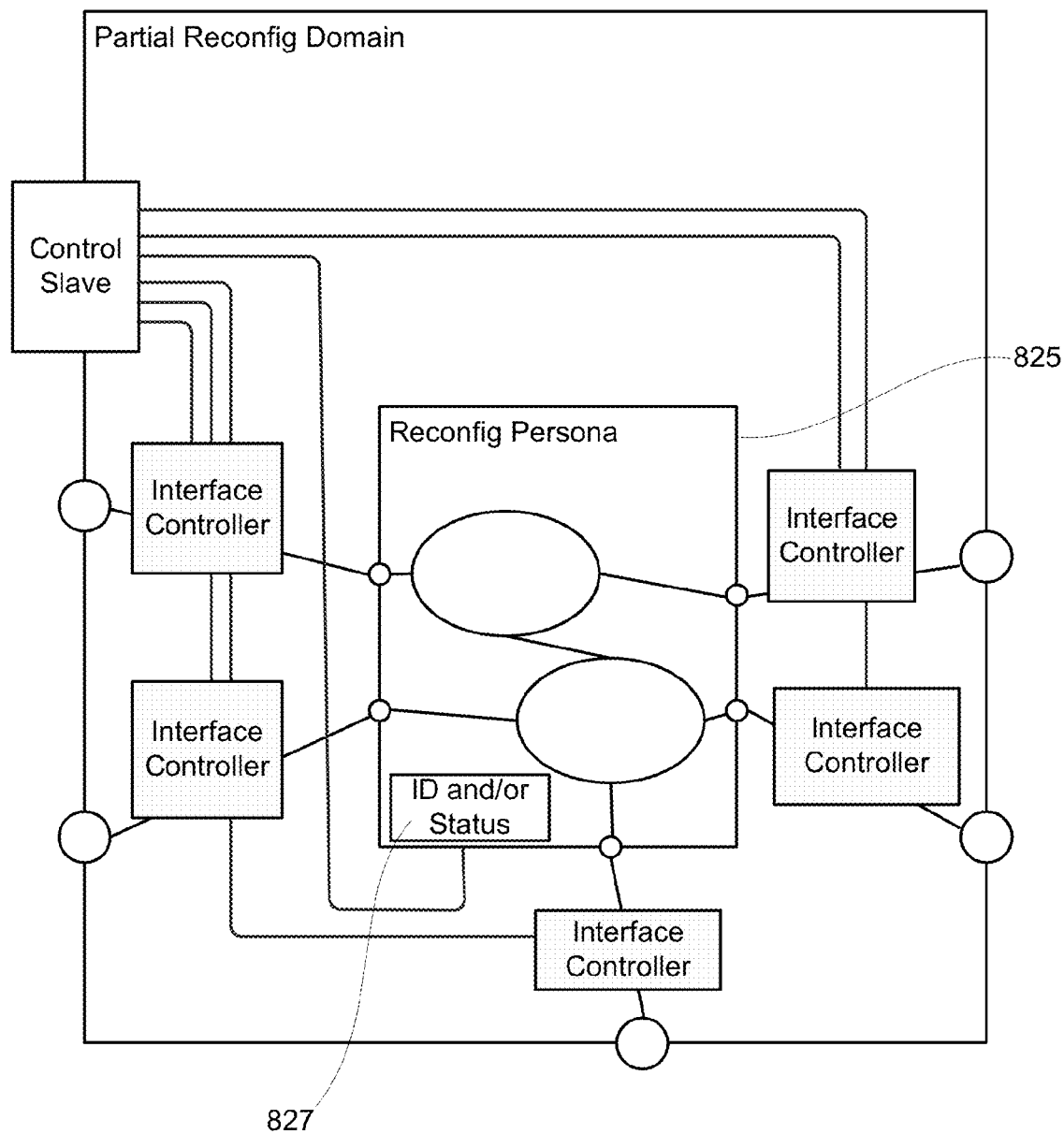
FIG. 8 shows an example of a PR domain, according to an implementation, illustrating an ID and/or status block.

In some implementations, referring now to FIG. 8, persona 825 may include one or both of an identification block and a reconfiguration status block 827. Block 827 may be instantiated by the system level design tool, for example and may be provided as an available IP component. In some implementations, a persona template may automatically insert and parameterize such a component.

Figure 9:
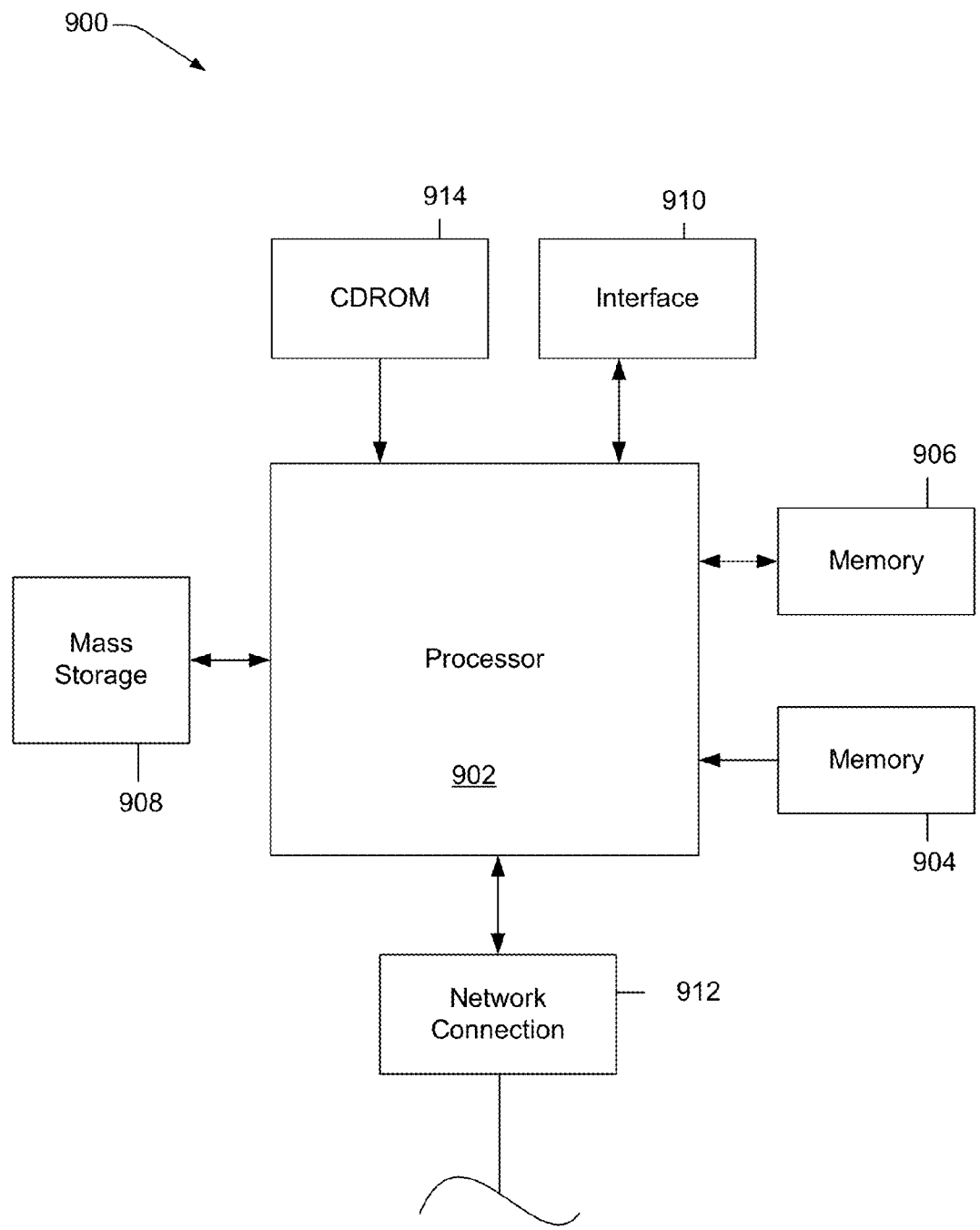
FIG. 9 is an example of a computer system configurable as a design tool is illustrated, in accordance with one implementation.

Referring now to FIG. 9, an example of a computer system configurable as a design tool is illustrated, in accordance with one implementation. The computer system 900 includes any number of processors 902 (also referred to as central processing units, or CPUs) that are coupled to devices including memory component 906 (typically a random access memory, or "RAM") and memory component 904 (typically a read only memory, or "ROM"). The processors 902 can be configured to support user design of a reconfigurable PLD as described hereinabove.

Memory components 902 and 904 may include any suitable type of the computer-readable media described above. A mass storage device 908 may also be coupled to CPU 902 to provide additional data storage capacity and may include any of the computer-readable media described above. The mass storage device 908 may be used to hold a library or database of prepackaged logic or intellectual property functions, as well as information on generating particular configurations. It will be appreciated that the information retained within the mass storage device 908, may, in appropriate cases, be incorporated in standard fashion as part of memory component 906 as virtual memory. A specific mass storage device such as a CD-ROM 914 may also pass data uni-directionally to the CPU.

CPU 902 may be coupled to an interface 910 that includes one or more input/output devices such as such as video monitors, track balls, mice, keyboards, microphones, touch-sensitive displays, transducer card readers, magnetic or paper tape readers, tablets, styluses, voice or handwriting recognizers, or other input devices such as, of course, other computers. The CPU 902 may be a design tool processor. Finally, CPU 902 optionally may, advantageously, be coupled to a computer or telecommunications network using a network connection as shown generally at 912. With such a network connection, it is contemplated that CPU 902 might receive information from the network, or might output information to the network in the course of performing the above-described process steps. More particularly, CPU 902 may be enabled to access "cloud-based" remote data bases of suitable personas and interface controllers for example. It should be noted that the system 900 might also be associated with devices for transferring completed designs onto a PLD.

Figure 10:
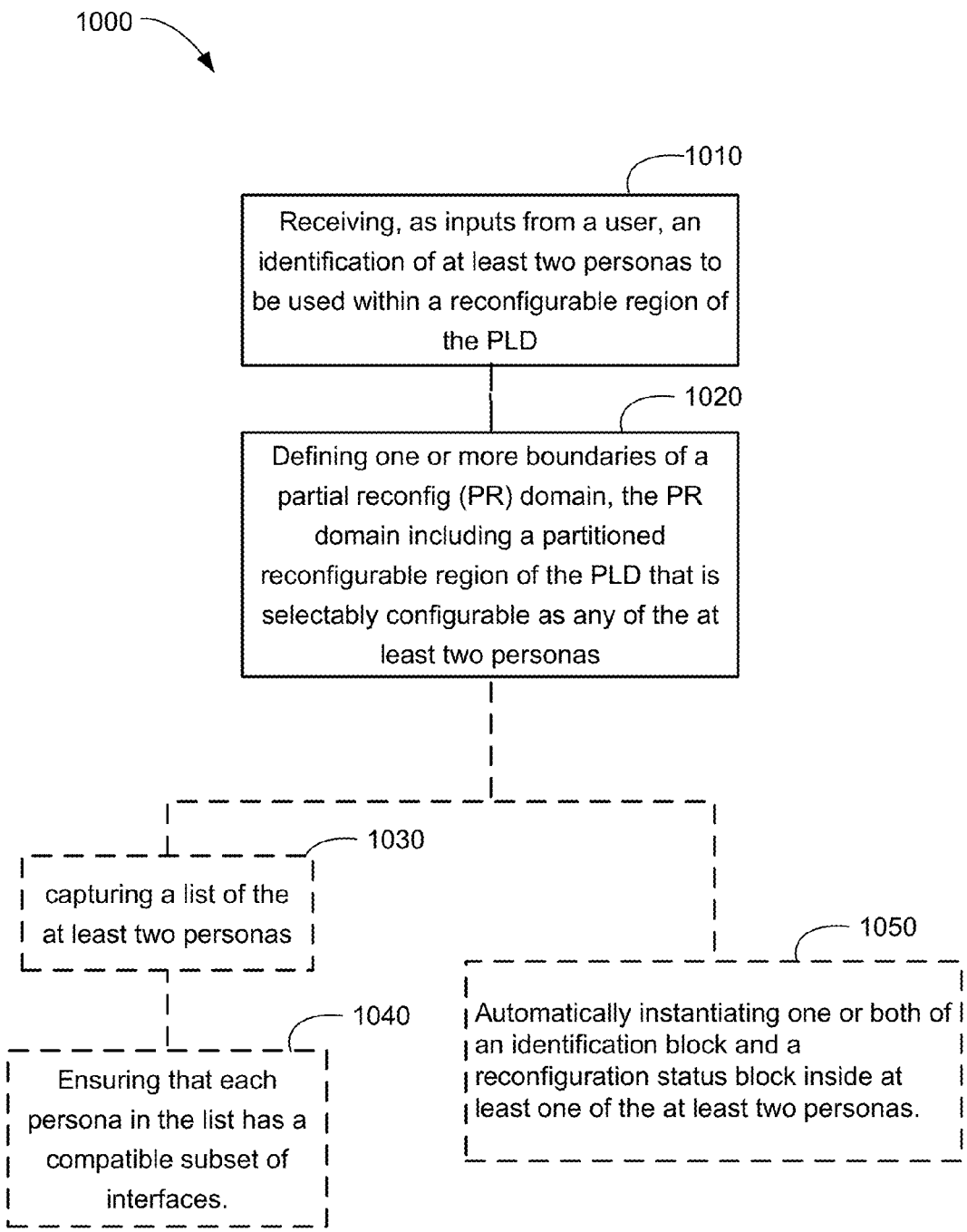
FIG. 10 shows a process flow diagram of an example method for designing a reconfigurable PLD.

Referring now to FIG. 10, a process flow 1000 for designing a reconfigurable programmable logic device (PLD) is illustrated. At block 1010, an identification of at least two personas to be used within a reconfigurable region of the PLD may be received inputs from a user. The user inputs may be received at a processor configured to run a system level design tool, as described hereinabove, for example.

At block 1020, one or more boundaries of a PR domain may be defined by the design tool, where the PR domain includes a partitioned reconfigurable region of the PLD that is selectably configurable as any of the at least two personas. In some implementations, the design tool, optionally, may capture a list of the at least two personas, block 1030. In such implementations, the design tool may optionally, in addition, ensure that each persona in the list has a compatible subset of interfaces, block 1040.

In some implementations the design tool, optionally, may instantiate one or both of an identification block and a reconfiguration status block inside at least one of the at least two personas, block 1050.

Although many of the components and processes are described above in the singular for convenience, it will be appreciated by one of skill in the art that multiple components and repeated processes can also be used to practice the techniques of the present invention In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, a data processing apparatus If implemented in software, the functions may be stored as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may be non-transitory and may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Thus, improved automated techniques for supporting user design of a reconfigurable PLD have been disclosed.

Although the foregoing systems and methods have been described in detail by way of illustration and example for purposes of clarity and understanding, it will be recognized that the above described systems and methods may be embodied in numerous other variations and embodiments without departing from the spirit or essential characteristics of the systems and methods. Certain changes and modifications may be practiced, and it is understood that the systems and methods are not to be limited by the foregoing details, but rather is to be defined by the scope of the appended claims

What is claimed is:

1. An apparatus for designing a reconfigurable programmable logic device (PLD), the apparatus comprising:
a processor configured to run a system level design tool, the processor accepting, as inputs from a user, an identification of at least two personas to be used within a partitioned reconfigurable region of the PLD, wherein:
the design tool (i) captures a list of the at least two personas, the list defining a superset of boundary interfaces that includes subsets of interfaces, each of the subsets of interfaces being associated with a respective one of the at least two personas; (ii) ensures that each persona in the list has a compatible subset of interfaces; and (iii) defines, as high-level interface descriptions, one or more boundaries of a partial reconfig (PR) domain inside the partitioned reconfigurable region of the PLD such that the PR domain is selectably reconfigurable as any of the at least two personas while at least one other portion of the PLD outside the partitioned reconfigurable region is still operating.

2. The apparatus of claim 1, wherein the design tool provides a graphical user interface (GUI), the GUI including a template that imposes the compatible subset of interfaces.

3. The apparatus of claim 1, wherein the design tool is configured to automatically instantiate one or both of an identification block and a reconfiguration status block inside at least one of the at least two personas.

4. The apparatus of claim 1, wherein the design tool is configured to support the simulation of partial reconfiguration.

5. The apparatus of claim 4, wherein the simulation includes simulating reconfiguration errors.

6. The apparatus of claim 5, wherein the simulation includes a functional coverage monitor, the functional coverage monitor being configured to inform the user when the simulation has covered all of a subset of cases to be tested.

7. The apparatus of claim 1, wherein the design tool is configured to allow a host PC to reconfigure the PR domain directly, without requiring the use of an embedded processor or state machine in the FPGA.

8. The apparatus of claim 1, wherein the design tool is configured to store events related to partial reconfiguration for post-failure debug.

9. A method for designing a reconfigurable programmable logic device (PLD), the method comprising:
receiving, at a processor configured to run a system level design tool, as inputs from a user, an identification of at least two personas to be used within a partitioned reconfigurable region of the PLD, wherein the design tool captures a list of the at least two personas, the list defining a superset of boundary interfaces that includes subsets of interfaces, each of the subsets of interfaces being associated with a respective one of the at least two personas and ensures that each persona in the list has a compatible subset of interface; and
defining, with the design tool, as high-level interface descriptions, one or more boundaries of a partial reconfig (PR) domain inside the partitioned reconfigurable region of the PLD such that the PR domain is selectably reconfigurable as any of the at least two personas while at least one other portion of the PLD outside the partitioned reconfigurable region is still operating.

10. The method of claim 9, further comprising automatically instantiating, with the design tool, one or both of an identification block and a reconfiguration status block inside at least one of the at least two personas.

11. The method of claim 9, wherein the design tool is configured to support the simulation of partial reconfiguration.

12. The method of claim 11, wherein the simulation includes simulating reconfiguration errors.

13. The method of claim 12, wherein the simulation includes a functional coverage monitor, the functional coverage monitor being configured to inform the user when the simulation has covered all of a subset of cases to be tested.

14. The method of claim 9, wherein the design tool is configured to allow a host PC to reconfigure the PR domain directly, without requiring the use of an embedded processor or state machine in the FPGA.

15. The method of claim 9, wherein the design tool is configured to store events related to partial reconfiguration for post-failure debug.

16. A non-transitory computer-readable storage medium having stored thereon instructions which, when executed by a processor, cause the processor to perform operations, the operations comprising:
- receiving, at a processor configured to run a system level design tool, as inputs from a user, an identification of at least two personas to be used within a partitioned reconfigurable region of the PLD, wherein the design tool captures a list of the at least two personas, the list defining a superset of boundary interfaces that includes subsets of interfaces, each of the subsets of interfaces being associated with a respective one of the at least two personas and ensures that each persona in the list has a compatible subset of interface; and
- defining, high-level interface descriptions, with the design tool, one or more boundaries of a partial reconfig (PR) domain inside the partitioned reconfigurable region of the PLD such that the PR domain is selectably reconfigurable as any of the at least two personas while at least one other portion of the PLD outside the partitioned reconfigurable region is still operating.

17. The storage medium of claim 16, wherein the operations further comprise automatically instantiating, with the design tool, one or both of an identification block and a reconfiguration status block inside at least one of the at least two personas.

18. The storage medium of claim 16, wherein the design tool is configured to allow a host PC to reconfigure the PR domain directly, without requiring the use of an embedded processor or state machine in the FPGA.

19. The storage medium of claim 16, wherein the design tool is configured to store events related to partial reconfiguration for post-failure debug.

* * * * *